(12) United States Patent  (10) Patent No.: US 7,582,559 B2
Yeo et al.  (45) Date of Patent: Sep. 1, 2009

(54) METHOD OF MANUFACTURING A SEMICONDUCTOR DEVICE HAVING VOIDS IN A POLYSILICON LAYER

(75) Inventors: In-Joon Yeo, Suwon-si (KR); Won-Jun Lee, Seoul (KR); Tae-Hyun Kim, Suwon-si (KR); Ji-Hong Kim, Seoul (KR); Byoung-Moon Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 11/249,515

(22) Filed: Oct. 14, 2005

(65) Prior Publication Data

US 2006/0088987 A1  Apr. 27, 2006

(30) Foreign Application Priority Data

Oct. 26, 2004  (KR) .................. 10-2004-0085629

(51) Int. Cl.
*H01L 21/4763* (2006.01)
(52) U.S. Cl. .............. 438/637; 257/E21.682; 257/E27.103
(58) Field of Classification Search ......... 438/255–266, 438/201, 288, 573, 652, 637, 647, 672, 694, 438/695
See application file for complete search history.

(56) References Cited

U.S. PATENT DOCUMENTS

| 6,465,293 | B2 | 10/2002 | Park et al. |
| 6,911,372 | B2 * | 6/2005 | Son ............................. 438/397 |
| 2002/0113273 | A1 * | 8/2002 | Hwang et al. ................ 257/374 |
| 2003/0207580 | A1 * | 11/2003 | Li et al. ...................... 438/700 |
| 2006/0068547 | A1 * | 3/2006 | Lee et al. ..................... 438/257 |

FOREIGN PATENT DOCUMENTS

| JP | 2000-269216 | 9/2000 |
| KR | 10-0356821 | 10/2002 |
| KR | 10-2004-0003895 | 1/2004 |

* cited by examiner

*Primary Examiner*—W. David Coleman
*Assistant Examiner*—Sonya D McCall-Shepard
(74) *Attorney, Agent, or Firm*—Harness, Dickey & Pierce, P.L.C.

(57) ABSTRACT

A method of manufacturing a semiconductor device includes forming an insulation pattern over a substrate. The insulation pattern has at least one opening that exposes a surface of the substrate. Then, a first polysilicon layer is formed over the substrates such that the first polysilicon layer fills the opening. The first polysilicon layer also includes a void therein. An upper portion of the first polysilicon layer is removed such that void expands to a recess and the recess is exposed. A second polysilicon layer is formed over the substrate such that the second polysilicon layer fills the recess.

22 Claims, 11 Drawing Sheets

METHOD OF MANUFACTURING A SEMICONDUCTOR DEVICE HAVING VOIDS IN A POLYSILICON LAYER

CLAIM OF PRIORITY

A claim of priority under 35 USC §119 is made to Korean Patent Application No. 2004-85629, filed on Oct. 26, 2004, the contents of which are herein incorporated by reference in their entirety.

BACKGROUND OF THE INVENTION

1. Field of the Invention

Example embodiments of the present invention generally relates to a method of manufacturing a semiconductor device. More particularly, the present invention relates to a method of removing voids formed in a polysilicon layer during a manufacturing of a semiconductor device.

2. Description of the Related Art

Generally, semiconductor memory devices are classified into a volatile memory device, which includes a dynamic random access memory (DRAM) and a static random access memory (SRAM), and a non-volatile memory device, which includes a read only memory (ROM), an electrically erasable and programmable ROM (EEPROM), and a flash memory. Data stored in a volatile memory device are lost after a period of time, however, the data are capable of rapid input/output function. On the contrary, data in a non-volatile memory device are not lost over a period of time, however, the data input/outputs functions are slower than a volatile memory device.

A flash memory device generally inputs/outputs data using Fowler-Nordheim (F-N) tunneling effect or channel hot electron injection effect.

In a general method of manufacturing a flash memory cell, an isolation layer may be provided on a semiconductor substrate An oxide layer may be formed on the isolation layer. The oxide layer may be patterned until a portion of the semiconductor substrate is exposed to form an oxide layer pattern. In a subsequent step, a floating gate may be formed on the exposed portion. A tunnel oxide layer and a first polysilicon layer may be sequentially formed on the resultant structure. The first polysilicon layer may be planarized until the tunnel oxide layer is exposed to form the floating gate. The tunnel oxide layer and the oxide layer pattern may be then partially etched. A dielectric layer may be formed on the resultant structure. A second polysilicon layer, a tungsten silicide layer and a hard mask layer may be sequentially formed on the dielectric layer. The second polysilicon layer, the tungsten layer and the hard mask layer may be patterned to form a control gate. Impurities may be implanted into portions of the semiconductor substrate exposed through the floating gate to form impurity regions.

According to the above-described method, the floating gate is self-aligned by the oxide layer pattern that partially exposes the semiconductor substrate.

Recently, as semiconductor devices have become more integrated, the aspect ratio of an opening, which is defined by an oxide layer pattern partially exposing a semiconductor substrate, has also increased. When the aspect ratio increases, voids may be generated in a polysilicon layer, which is used to fill the opening, due to geometrical dimensions of the oxide layer pattern.

The voids may be exposed when the polysilicon layer is planarized. The voids may deteriorate breakdown voltage characteristics of a dielectric layer on a floating gate, and/or may decrease a coupling ratio of the flash memory device. The voids may also deteriorate leakage current characteristics of the dielectric layer.

SUMMARY OF THE INVENTION

The present invention relates to a method of manufacturing a semiconductor device that reduces the effects of voids in a polysilicon layer.

In an embodiment of the present invention, a method of manufacturing a semiconductor device includes forming an insulation pattern over a substrate. The insulation pattern has at least one opening that exposes a surface of the substrate. Then, a first polysilicon layer is formed over the substrates such that the first polysilicon layer fills the opening. The first polysilicon layer also includes a void therein. An upper portion of the first polysilicon layer is removed such that void expands to a recess and the recess is exposed. A second polysilicon layer is formed over the substrate such that the second polysilicon layer fills the recess.

BRIEF DESCRIPTION OF THE DRAWINGS

The present invention will become more apparent from the description of the detailed exemplary embodiments thereof with reference to the accompanying drawings, in which.

DESCRIPTION OF THE INVENTION

The invention is described more fully hereinafter with reference to the accompanying drawings, in which example embodiments of the invention are shown. This invention may, however, be embodied in many different forms and should not be construed as limited to the embodiments set forth herein. Rather, these embodiments are provided as teaching examples. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below may be termed a second element, component, region, layer or section without departing from the teachings of the present invention.

Spatially relative terms, for example "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. For example, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, for example those defined in commonly used dictionaries, should be interpreted as having a meaning that is consistent with their meaning in the context of the relevant art and will not be interpreted in an idealized or overly formal sense unless expressly so defined herein.

FIGS. 1 to 12 are cross sectional views illustrating a method of manufacturing a semiconductor device in accordance with an embodiment of the present invention.

Figure 1:
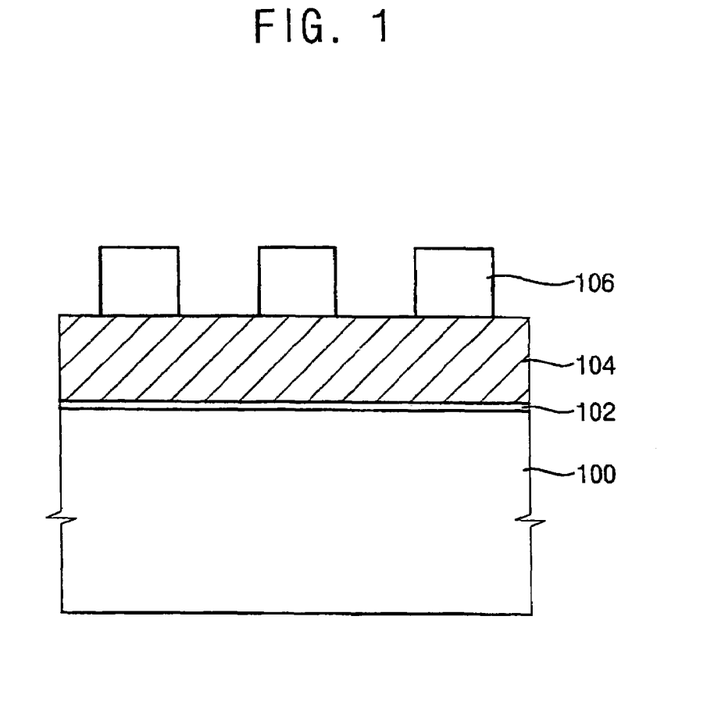
FIGS. 1 to 12 are cross sectional views illustrating a method of manufacturing a semiconductor device in accordance with an embodiment of the present invention.
Figure 2:
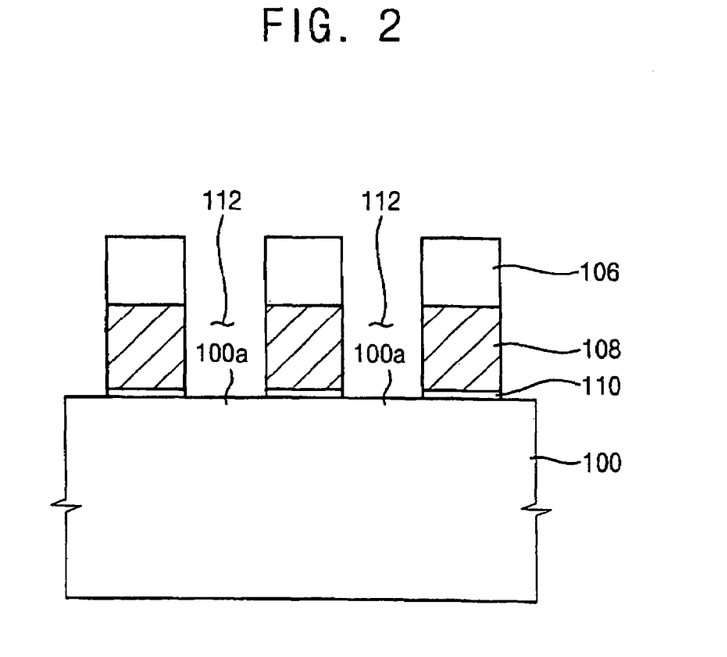

FIG. 1 is a cross sectional view illustrating a pad oxide layer and a mask layer formed on a semiconductor substrate, and FIG. 2 is a cross sectional view illustrating a mask pattern formed from the mask layer in FIG. 1.

Referring to FIGS. 1 and 2, a pad oxide layer 102 may be formed on a semiconductor substrate 100 such as a silicon wafer, and then a mask layer 104 may be formed on the pad oxide layer 102.

The pad oxide layer 102 may be formed by a thermal oxidation process or a chemical vapor deposition (CVD) process to a thickness of about 70 to about 100 Å. The pad oxide layer 102 may be formed at temperature about 750 to about 900° C., to treat a surface of the semiconductor substrate 100.

The mask layer 104, which may include silicon nitride, may be formed on the pad oxide layer 102 to a thickness of about 1,500 Å by a low pressure chemical vapor deposition (LPCVD) process using SiH2Cl2 gas, SiH4 gas, and NH3 gas, or a plasma enhanced chemical vapor deposition (PECVD) process.

A photoresist film (not shown) may be formed on the mask layer 104. The photoresist film may be partially patterned by a photolithography process to form a photoresist pattern 106 on the mask layer 104. The mask layer 104 may be partially exposed through the photoresist pattern 106.

In FIG. 2, the pad oxide layer 102 and the mask layer 104 may be sequentially etched using the photoresist pattern 106 as an etching mask to form a mask pattern 108 and a pad oxide layer pattern 110 exposing an isolation region 100a. In particular, the mask pattern 108 and pad oxide layer pattern 110 defines a first opening 112 that exposes the isolation region 100a.

In an example present embodiment, the pad oxide layer 102 and the mask layer 104 may be etched by a dry etching process using plasma or reactive ion etching.

After forming the mask pattern 108 and the pad oxide pattern 110, the photoresist pattern 106 may be removed from the mask pattern 108 by an ashing process using O2 plasma and/or a strip process.

Figure 3:
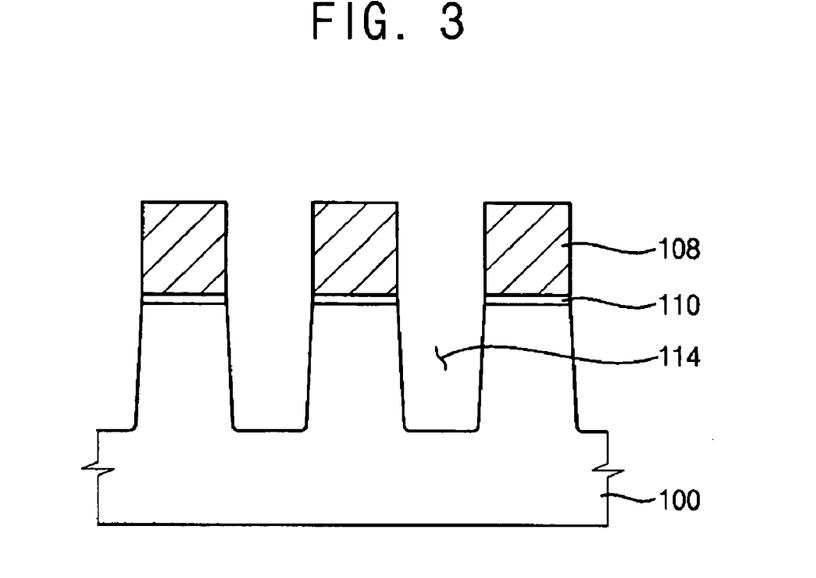
Figure 4:
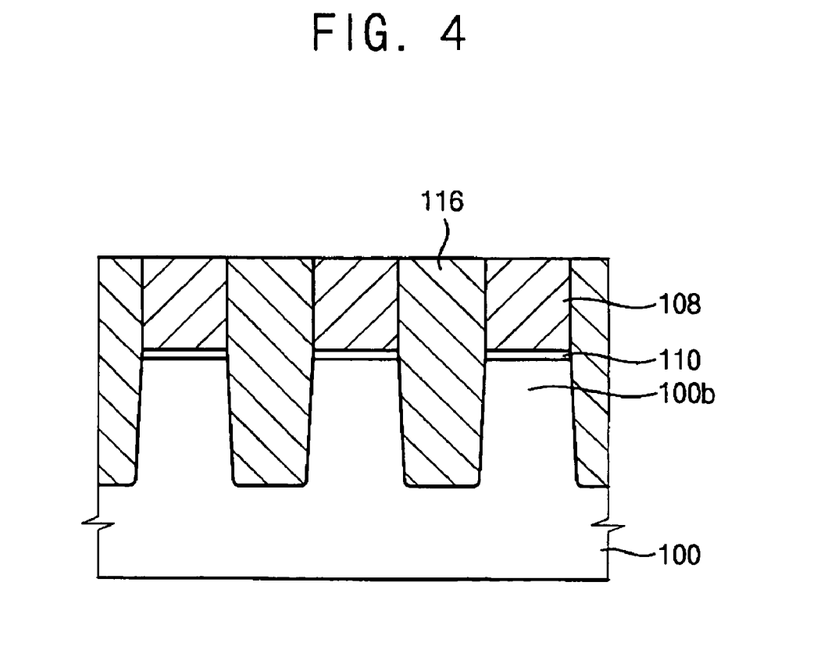

FIG. 3 is a cross sectional view illustrating a trench formed at a surface portion of the semiconductor substrate using the mask pattern in FIG. 2. FIG. 4 is a cross sectional view illustrating the trench with a field insulation pattern.

Referring to FIGS. 3 and 4, the isolation region 100a is etched using the mask pattern 108 as an etching mask to form a trench 114 within the semiconductor substrate 100 crossing over the semiconductor substrate 100 in a first direction (e.g., into and out of). The trench 114 may have a depth of about 1,000 to about 5,000 Å, for example, about 2,300 Å.

As described above, after the first opening 112 is formed using the photoresist pattern 106, the trench 114 may be formed using the mask pattern 108. Optionally, the first opening 112 and the trench 114 may be formed at the same time in-situ in a single process chamber using the photoresist pattern 106.

To repair damage to the semiconductor substrate 100 caused by the etching process during the formation of the trench 114 and to reduce or prevent leakage current, the semiconductor substrate 100 may be thermally treated to form a trench oxide layer (not shown) having a thickness of about 50 Å to about 250 Å on an inner surface of the trench 114.

To reduce or prevent impurities, for example carbon or hydrogen in a layer, such as a field insulation layer, from diffusing into an active region 100b, a liner nitride layer (not shown) having a thickness of about 50 to 100 Å may be formed on the trench oxide layer.

A field insulation layer (not shown) may be formed in the trench 114 and the first opening 112. The field insulation layer may include silicon oxide such as undoped silicate glass (USG), tetra-ethyl-ortho-silicate (TEOS), and high-density plasma (HDP) oxide. In an example embodiment, an HDP oxide formed using a plasma source including SiH4 gas, oxygen gas (O2) and argon gas (Ar) may be used to form the field insulation layer.

The field insulation layer may be planarized by chemical mechanical polishing (CMP) process until a surface of the mask pattern 108 is exposed to form a field insulation pattern 116. The field insulation pattern 116 may function as an isolation layer, and may define the active region 100b of the semiconductor substrate 100.

Figure 5:
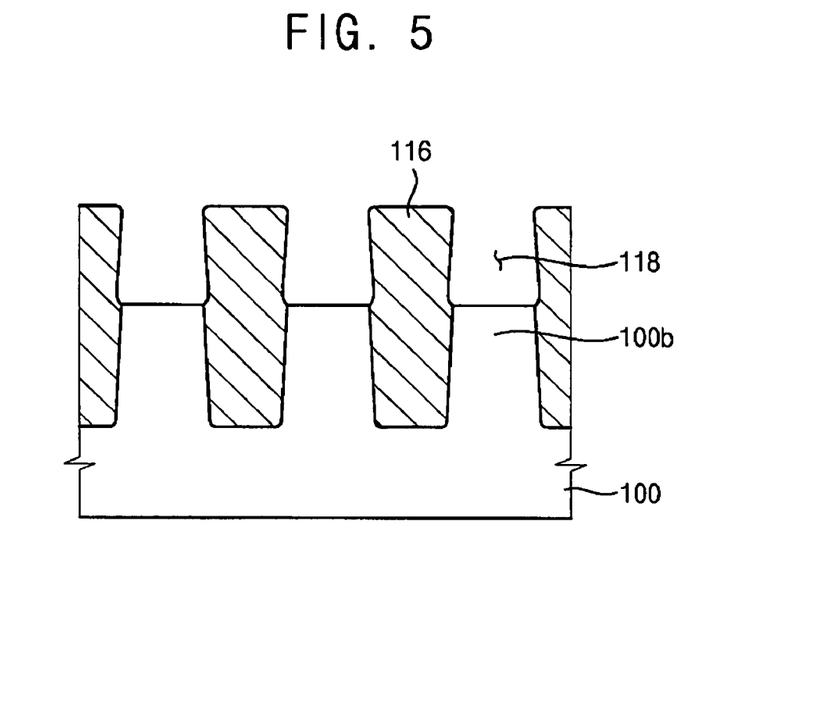

FIG. 5 is a cross sectional view illustrating a second opening that exposes the active region 100b defined by the field insulation pattern 116 in FIG. 4.

Referring to FIG. 5, the mask pattern 108 and the pad oxide layer pattern 110 may be removed by a dry etching process or a wet etching process to form a second opening 118 exposing the active region 100b. The second opening 118 is defined by the field insulation pattern 116. For example, the wet etching process may use an etching solution including phosphorous and diluted hydrofluoric acid solution. A surface portion of the field insulation pattern 116 may be partially etched in removing the mask pattern 108 and the pad oxide layer 110.

Figure 6:
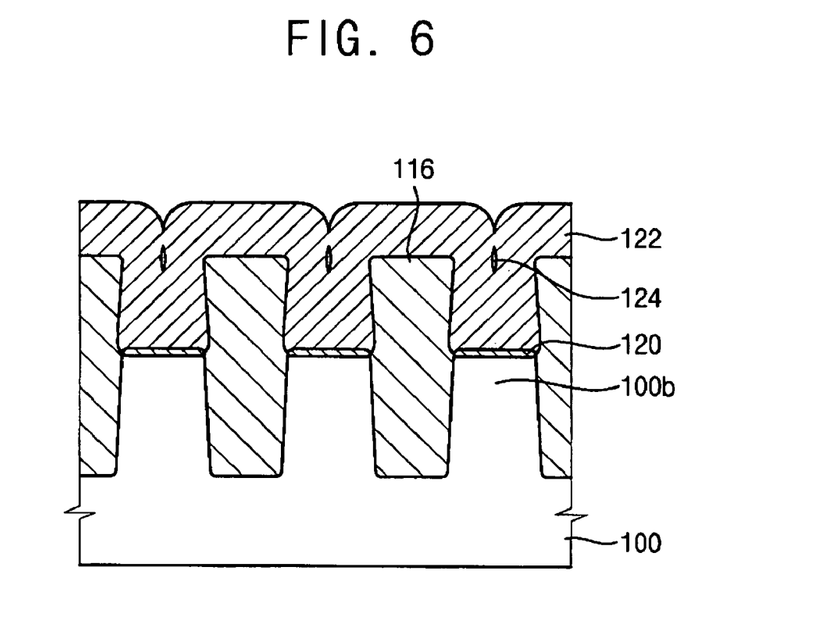

FIG. 6 is a cross sectional view illustrating a first polysilicon layer formed on the active region and the field insulation pattern in FIG. 5.

Referring to FIG. 6, a first dielectric layer (or a tunnel oxide layer) 120 may be formed on the exposed active region 100b. The first dielectric layer 120 may be formed of silicon oxide by a thermal oxidation process. Optionally, the first dielectric layer may be formed of a silicon oxide layer doped with fluorine (F), a silicon oxide layer doped with carbon (C), and/or a dielectric layer having a low dielectric constant.

The dielectric layer having a low dielectric constant may include an organic polymer such as polyallylether resins, annular fluorine resins, siloxane copolymers, fluorinated polyallylether resins, pentafluorinestyrene, polytetrafluorinestyrene resin, fluorinated polyimide resin, fluorinated polynaftalene, and fluorinated polycide resin. These organic polymers may be used alone or in a combination. The organic polymer may be formed by plasma enhanced chemical vapor deposition (PECVD), high-density plasma chemical vapor deposition (HDP-CVD), atmospheric pressure chemical vapor deposition (APCVD), and/or a spin coating process.

A first polysilicon layer 122 may be formed on the first dielectric layer 120 and the field insulation pattern 116, and may fill the second opening 118. In an example embodiment, the first polysilicon layer 122 may be formed by low-pressure chemical vapor deposition (LPCVD). Impurities may be implanted into the first polysilicon layer 122 by an impurity diffusion process, an ion implantation process, and an in-situ doping process.

When the first polysilicon layer 122 is formed, a void 124 having a width of several tens of angstrom may be formed within the first polysilicon layer 122 due to geometrical dimensions of the field insulation pattern 116 and the second opening. The dimension and the number of voids 124 may be proportional to the aspect ratio of the second opening 118. The void 124 may deteriorate electric characteristics of a floating gate, which is formed subsequently. The void 124 may continuously extend in the first direction. Further, in general, the plurality of the voids 124 are locally arranged in the first direction.

Figure 7:
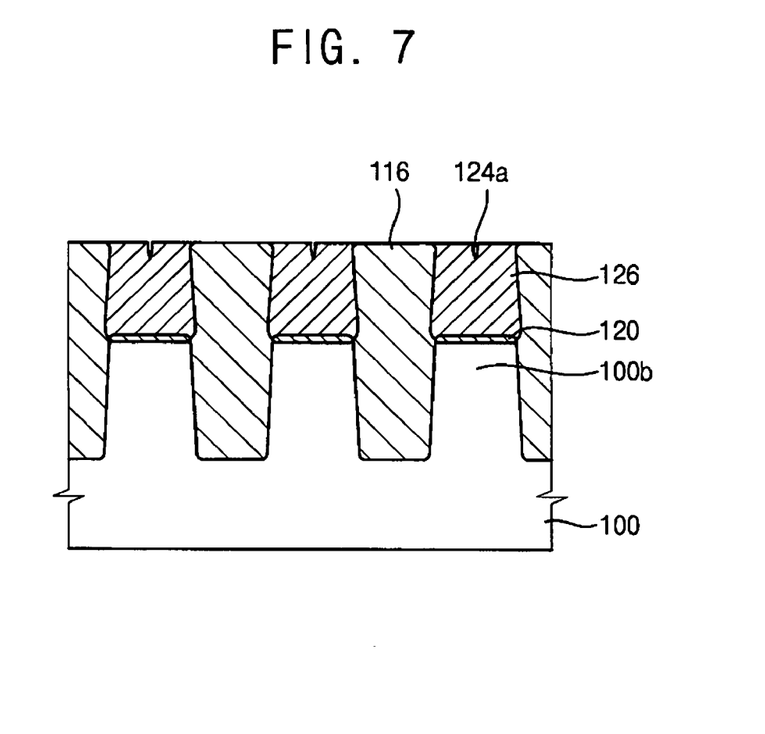

FIG. 7 is a cross sectional view illustrating a first polysilicon pattern formed in the second opening in FIG. 5.

Referring to FIG. 7, the first polysilicon layer 122 may be planarized to form a first preliminary polysilicon pattern 126 in the second opening 118. The first polysilicon layer 122 may be polished by a CMP process until a surface of the field insulation pattern 116 is exposed to form the first preliminary polysilicon pattern 126 in the second opening 118. The planarization may expose the void 124 in the first polysilicon layer 122 during the formation of the first preliminary polysilicon pattern 126. An exposed void 124a may have a "V" shaped cross-section and a width of about 50 to 150 Å. A plurality of the exposed voids 124a may be discontinuously exposed through a central portion of the upper face of the first preliminary polysilicon pattern 126 in the first direction.

Figure 8:
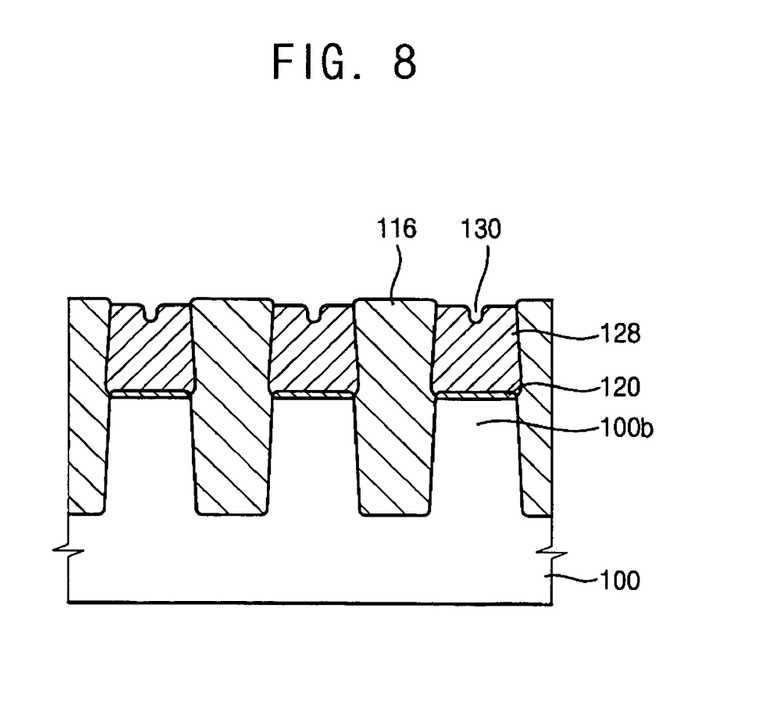

FIG. 8 is a cross sectional view illustrating a second polysilicon pattern formed in the second opening in FIG. 5.

In an example embodiment, the first preliminary polysilicon pattern 126 may be partially etched by a wet etching process to form a second preliminary polysilicon pattern 128. The etching process may increase the size of the exposed voids 124a, creating a recess 130 with an average width of about 100 to about 300 Å. The wet etching process may use an etching solution such as a standard cleaning solution (SC-1) or a new standard cleaning solution (NSC-1). Slurry and byproducts remaining on the first preliminary polysilicon pattern 126, which are generated in etching the first preliminary polysilicon pattern 126, are removed.

The NSC-1 may include NH4OH, H2O2 and H2O in a molar ratio of about 3-10:1:60-200, may be in a molar ratio of about 4:1:95. In exemplary embodiments, the etching process may be performed at a temperature of about 70 to about 90° C., for example about 80° C.

The surface of the field insulation pattern 116 may also be partially etched when the first preliminary polysilicon pattern 126 is partially etched to create the second preliminary polysilicon pattern 128. For example, if the first preliminary polysilicon pattern 126 is etched using the etchant such as the SC-1 including NH4OH, H2O2 and H2O in a molar ratio of about 1:4:20 at a temperature of about 70° C., an etching selectivity between polysilicon of the first preliminary polysilicon pattern 126 and silicon oxide of the first insulating pattern 116 is about 5.5:1. In other words, an etching rate of polysilicon may be about 8 Å/min, and an etching rate of silicon oxide may be about 1.4 Å/min.

Optionally, if the first polysilicon pattern 126 is etched by the etchant such as NSC-1 including NH4OH, H2O2 and H2O in a molar ratio of about 4:1:95 at a temperature of about 80° C., an etching selectivity between polysilicon of the first preliminary polysilicon pattern 126 and silicon oxide of the first insulating pattern 116 may be about 12.5:1. In other words, an etching rate of polysilicon is about 31.5 Å/min, and an etching rate of silicon oxide may be about 2.5 Å/min.

The recess 130, selectively formed by expanding the exposed void 124a, has a "U" shape, thereby the recess 130 is easier to fill with a second polysilicon layer formed in a subsequent step described below.

When the first preliminary polysilicon pattern 126 is etched, hydrogen peroxide (H2O2) of the SC-1 or the NSC-1 and the first preliminary polysilicon pattern 126 react with each other to form a byproduct layer (not shown) including silicon oxide on the second preliminary polysilicon pattern 128. The byproduct layer may deteriorate electrical characteristics of a floating gate formed subsequently. Thus, the byproduct layer may be removed by a wet etching process using diluted hydrofluoric acid.

Figure 9:
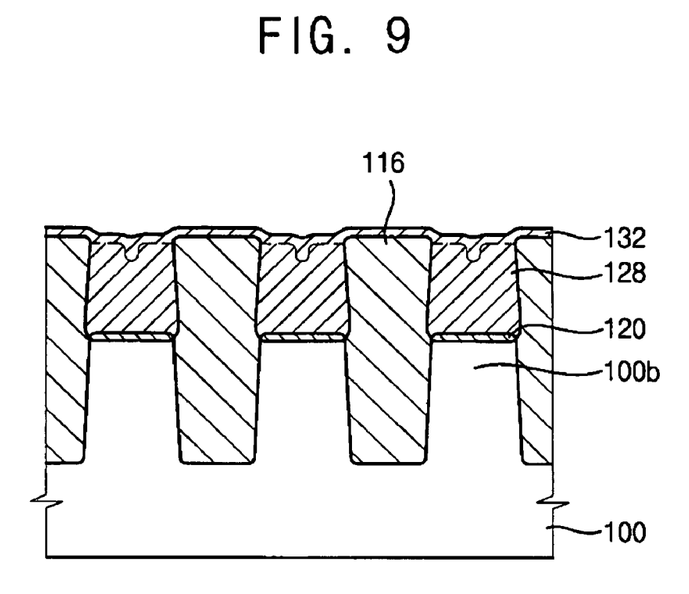

FIG. 9 is a cross sectional view illustrating a second polysilicon layer formed on the second preliminary polysilicon pattern in FIG. 8.

Referring to FIG. 9, a second polysilicon layer 132 is formed on the preliminary second polysilicon pattern 128 and the field insulation pattern 116. As shown, the second polysilicon layer 132 fills the recess 130. A method of forming the second polysilicon layer 132 may be substantially the same as in forming the first polysilicon layer 122.

As illustrating in FIG. 9, to fully fill the recess 130 with the second polysilicon layer 132, the second polysilicon layer 132 may have a thickness of no less than about 0.5 times the average width of the recess 130. For example, the second polysilicon layer 132 may have a thickness of about 50 Å to about 200 Å.

Figure 10:
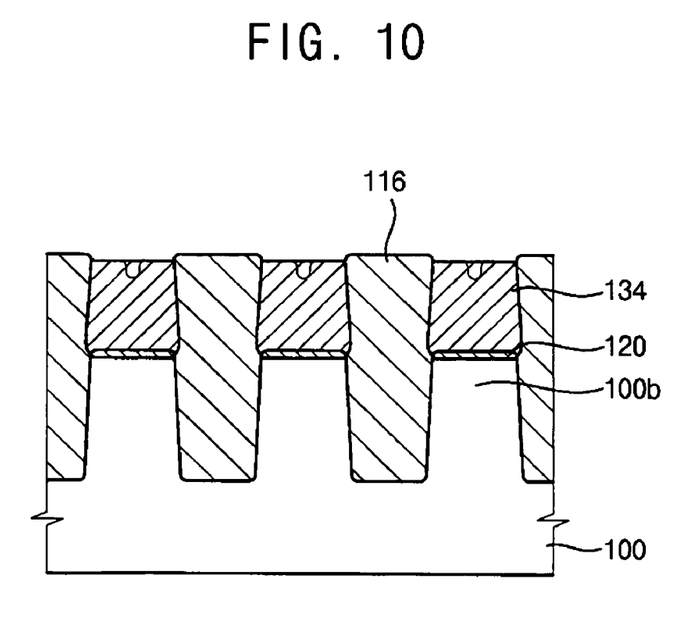
Figure 11:
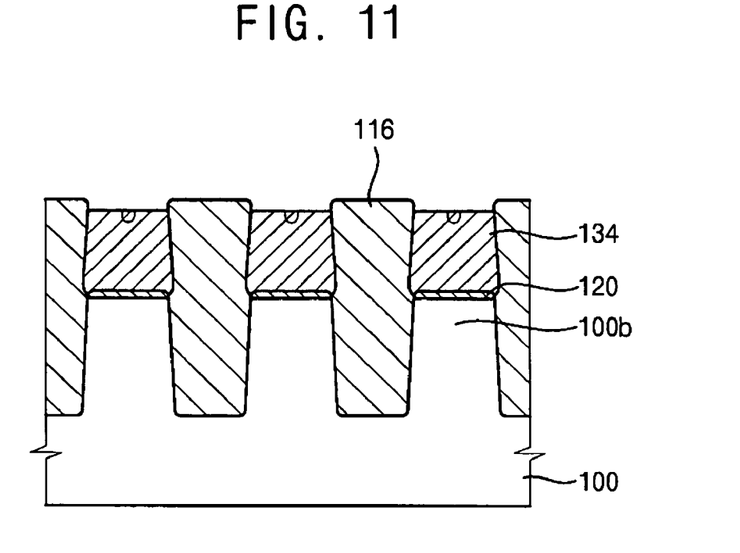

FIGS. 10 and 11 are cross sectional views illustrating a polysilicon pattern formed in the second opening in FIG. 5.

Referring to FIG. 10, the second polysilicon layer 132 may be partially removed to form a polysilicon pattern 134, which may serve as part a later formed floating gate. The second polysilicon layer 132, except for the portion filling the recess 130, may be removed to form the polysilicon pattern 134.

Referring to FIG. 11, a surface portion of the polysilicon pattern 134 that is exposed by partially removing the second polysilicon layer 132 may be continuously removed. A thickness of the polysilicon pattern 134 may be controlled in accordance with a desired thickness of the floating gate.

The polysilicon pattern 134 may be etched using an etchant, for example, SC-1 and/or NSC-1. The etching process for partially removing the second polysilicon layer 132 and the second polysilicon pattern 134 may be controlled in accordance with an etching time corresponding to the desired amount to be etched. In exemplary embodiments, the desired etching amount may be substantially equal to or more than the thickness of the second polysilicon layer 132. For example, the desired etching amount may be substantially identical to or greater than about 1 to 50 Å more than the thickness of the second polysilicon layer 132.

Figure 12:
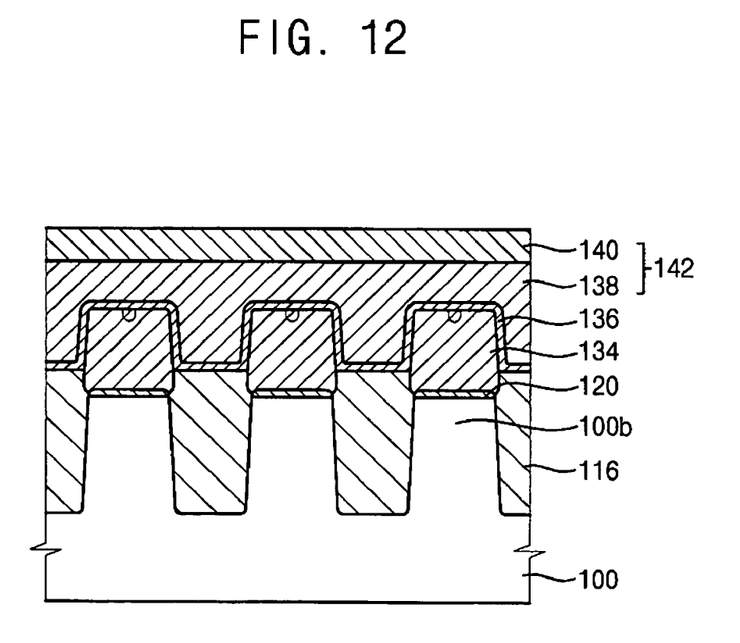

FIG. 12 is a cross sectional view illustrating a control gate layer and a second dielectric layer formed on the floating gate in FIG. 11.

Referring to FIG. 12, to improve a coupling ratio of a semiconductor device, for example a flash memory device, an upper portion of the field insulation pattern 116 protruding above the surface of the semiconductor substrate 100 may be etched for example, by an anisotropic etching process or an isotropic etching process to partially expose sidewalls of the polysilicon pattern 134. To reduce or prevent the first dielectric layer 120 from being damaged by an etchant used in etching the field insulation pattern 116, the first dielectric layer 120 should not need be exposed during the etching of the field insulation pattern 116. Meanwhile, the etching process may be controlled in accordance with an etching time. For example, the upper portion of the field insulation pattern 116 may be removed using an etchant including diluted hydrofluoric acid solution.

A second dielectric layer 136 may be formed on the field insulating pattern 116 and the polysilicon pattern 134. Examples of the second dielectric layer 136 may include a composite dielectric layer having oxide/nitride/oxide (ONO) and/or a dielectric layer having a high dielectric constant. The composite dielectric layer may be formed by a LPCVD process. Examples of oxides used to form the dielectric layer having a high dielectric constant include Y2O3, HfO2, ZrO2, Nb2O5, BaTiO3, and SrTiO3. These oxides may be used alone or in a combination. Further, the dielectric layer having a high dielectric constant may be formed by an atomic layer deposition (ALD) process or a CVD process. The second dielectric layer 136, the polysilicon pattern 134 and the first dielectric layer 120 may be successively patterned to form a floating gate.

A control gate layer 142 may be formed on the second dielectric layer 136. The control gate layer 142 may include a first conductive layer 138 including doped polysilicon, and a second conductive layer 140 including metal silicide, for example tungsten silicide (WSix), titanium silicide (TiSix), cobalt silicide (CoSix), and/or tantalum silicide (TaSix).

The control gate layer 142 may be patterned by an etching process to form a control gate (not shown) extending in a second direction substantially perpendicular to the first direction on the second dielectric layer 136.

Optionally, impurities may be implanted into the active region 100b of the semiconductor substrate 100 at both sides of the gate structure to form source/drain regions (not shown), thereby completing a semiconductor device, for example a flash memory device.

The method of the present embodiment may be easily employed in manufacturing a semiconductor device that has an active region with a width of no more than 90 nm. In addition, the method of the present embodiment may be employed in manufacturing a semiconductor device that has an active region having a width of above about 90 nm.

FIGS. 13 to 17 are cross sectional views illustrating a method of manufacturing a semiconductor device in accordance with another embodiment of the present invention.

Figure 13:
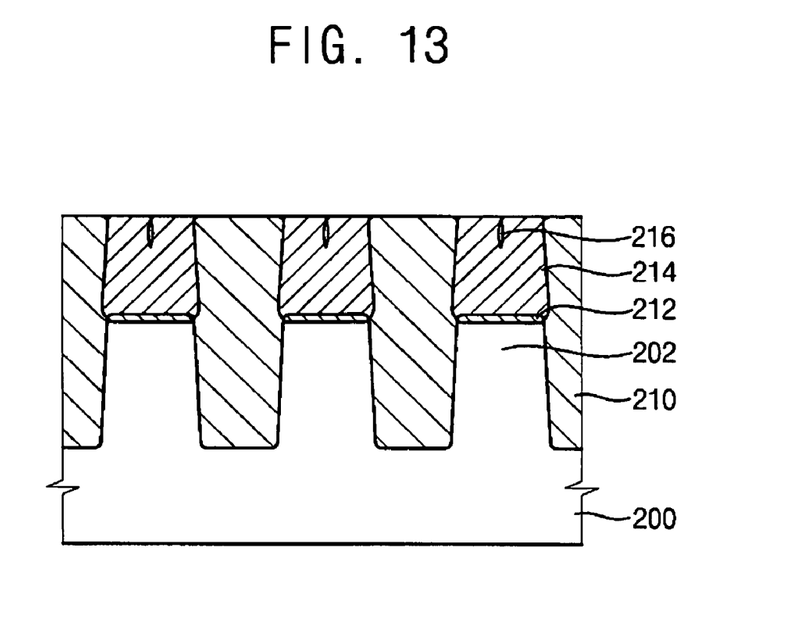
FIGS. 13 to 17 are cross sectional views illustrating a method of manufacturing a semiconductor device in accordance with another embodiment of the present invention.

In this embodiment the same processing steps as described above with respect to FIGS. 1 through 5 may be performed to create a field insulation pattern 210, which may define an active region 202 of a semiconductor substrate 200, extending in a first direction crossing over the semiconductor substrate 200. As shown in FIG. 13, the field insulation pattern 210 may have a lower portion that is located within the semiconductor substrate 200, and an upper portion that protrudes above the semiconductor substrate 200.

A first dielectric layer 212 and a first polysilicon layer may be formed over the semiconductor substrate 200 in the same manner as the first dielectric layer 120 and the first polysilicon layer 122 in FIG. 6. Thus, as shown in FIG. 13, the first polysilicon layer (not shown) formed on the field insulation pattern 210 and the first dielectric layer 212 may be planarized by chemical mechanical polishing (CMP) process to form a first preliminary polysilicon pattern 214 that is defined by the field insulation pattern 210 and the dielectric layer 212. The first dielectric layer 212, which may include silicon oxide or a low dielectric constant material (or a material having a low dielectric constant), may be formed on the active region 202 of the semiconductor substrate 200.

A void 216 in an upper portion of the first preliminary polysilicon pattern 214 may be generated in forming the first polysilicon layer.

Figure 14:
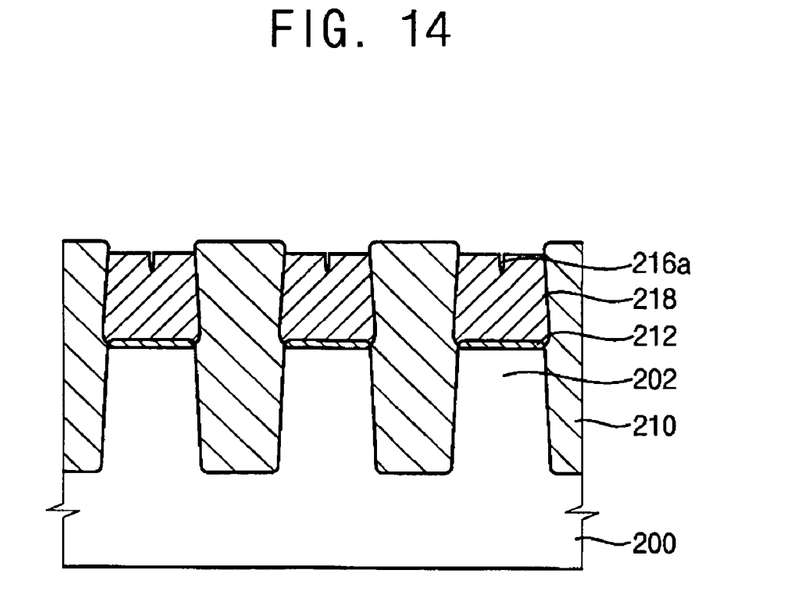
Figure 15:
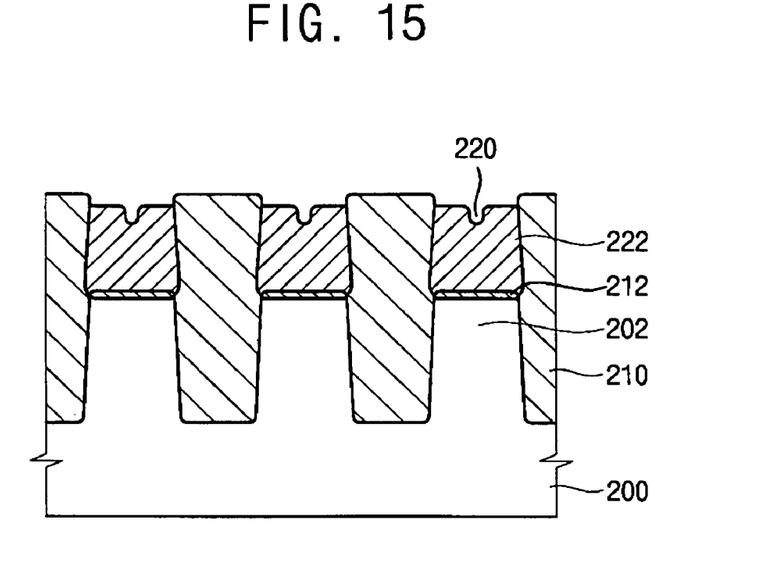

FIG. 14 is a cross sectional view illustrating a second preliminary polysilicon pattern formed on the first dielectric layer in FIG. 13. FIG. 15 is a cross sectional view illustrating a third preliminary polysilicon pattern formed on the first dielectric layer in FIG. 13.

Referring to FIGS. 14 and 15, a surface portion of the first preliminary polysilicon pattern 214 may be removed to form a second preliminary polysilicon pattern 218, which exposes void 216a. A surface portion of the second preliminary polysilicon pattern 218 is removed to form a third preliminary polysilicon pattern 222 and a recess 220.

In an example embodiment, the second preliminary polysilicon pattern 218 and the third preliminary polysilicon pattern 222 are sequentially etched using a SC-1 solution and/or a NSC-1 solution. The recess 220 is formed by expanding the exposed void 216a. The recess 220 may be formed at locations corresponding to the exposed void 216a.

The exposed void 216a may have a width of about 50 to about 150 Å and the recess 220 may have an average width of about 100 to about 300 Å.

A silicon oxide layer (not shown), formed by the reaction between hydrogen peroxide (H2O2) in the SC-1 solution and/or the NSC-1 solution and polysilicon in the etching process to form the recess 220, may be removed. For example, the silicon oxide layer may be removed using diluted hydrofluoric acid.

Figure 16:
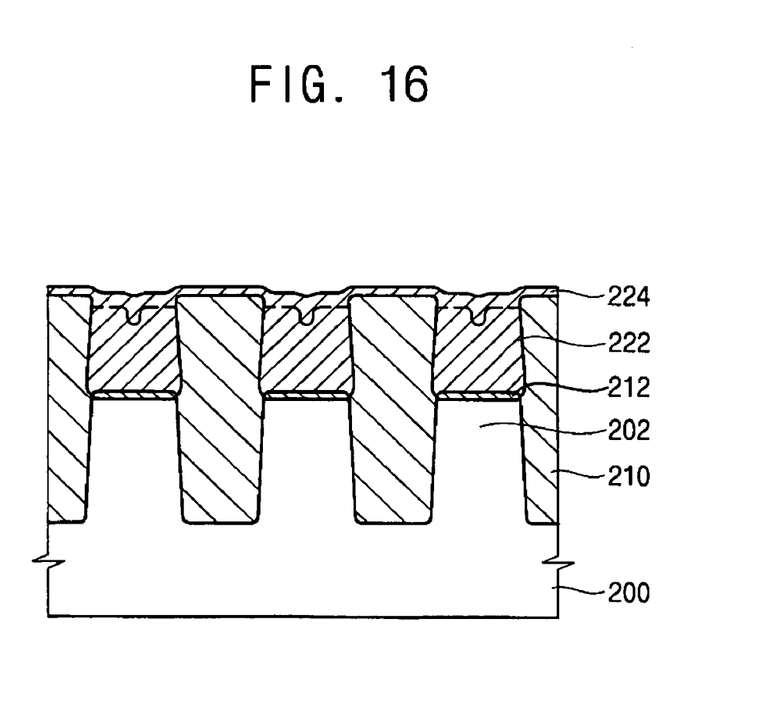
Figure 17:
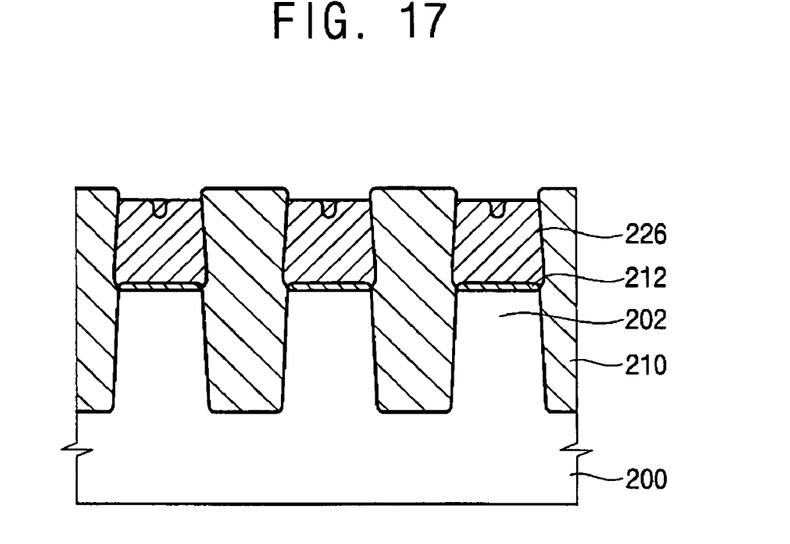

FIG. 16 is a cross sectional view illustrating a second polysilicon layer formed on the third preliminary polysilicon pattern in FIG. 15. FIG. 17 is a cross sectional view illustrating a polysilicon pattern formed on the third preliminary polysilicon pattern in FIG. 15.

Referring to FIGS. 16 and 17, a second polysilicon layer 224 is formed on the third preliminary polysilicon pattern 222 to fill the recess 220. The second polysilicon layer 224 may have a thickness of no less than about 0.5 times the average width of the recess 130. The second polysilicon layer 224, for example, may have a thickness of about 50 to about 200 Å.

The second polysilicon layer 224 may be partially removed to form a polysilicon pattern 226, which will serve as part of a floating gate on the first dielectric layer 212. The second polysilicon layer 224 may be removed by a wet etching process using SC-1 solution and/or NSC-1 solution.

Optionally, the second polysilicon layer 224 and the third preliminary pattern 222 may be partially and/or sequentially removed to form the polysilicon pattern 226.

After forming the polysilicon pattern 226, the field insulation pattern 210 may be partially removed using a diluted hydrofluoric acid solution to partially expose sidewalls of the polysilicon pattern 226. A second dielectric layer (not shown) and a control gate layer (not shown) are sequentially formed on the polysilicon pattern 226. The control gate layer may be patterned to form a control gate extending in a direction substantially perpendicular to an extending direction of the polysilicon pattern 226. The second dielectric layer, the polysilicon pattern 226 and the first dielectric layer 212 may be successively patterned to expose the active region 202 of the semiconductor substrate. Source/drain regions (not shown) may be formed on the exposed active region 202. Impurities may be implanted into the exposed active region 202 to form source/drain regions.

The above-mentioned elements and steps of manufacturing the same, for example, the control gate and the source/drain region are omitted herein.

Figure 18:
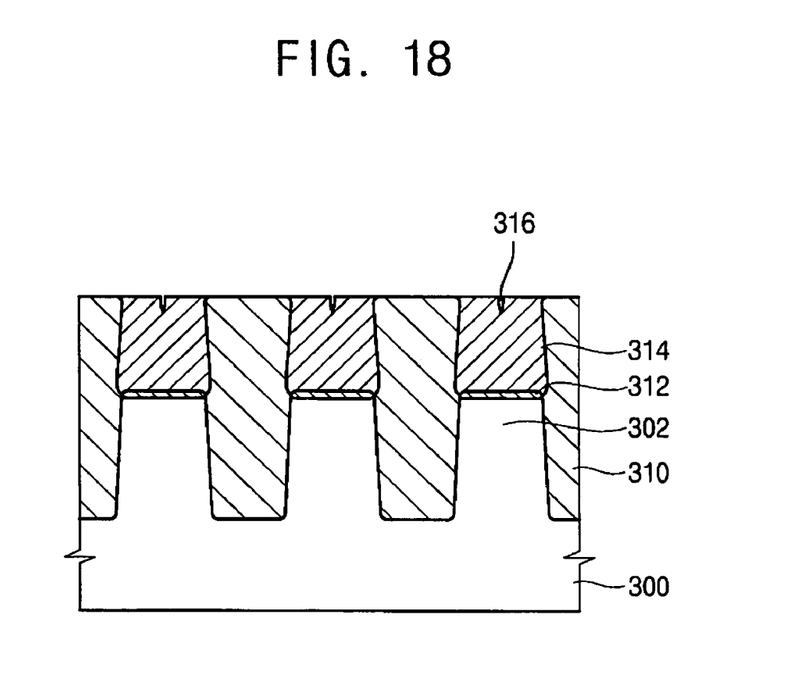
FIGS. 18 to 22 are cross sectional views illustrating a method of manufacturing a semiconductor device in accordance with another embodiment of the present invention.
Figure 21:
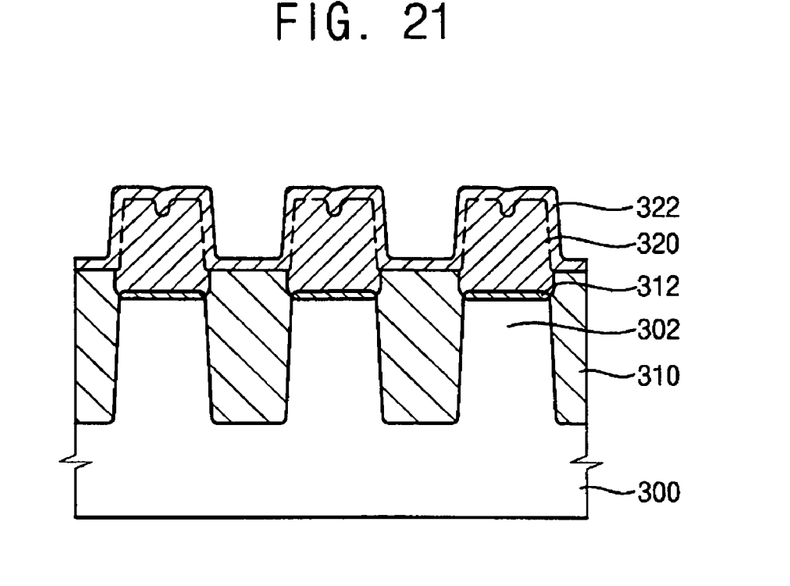
Figure 22:
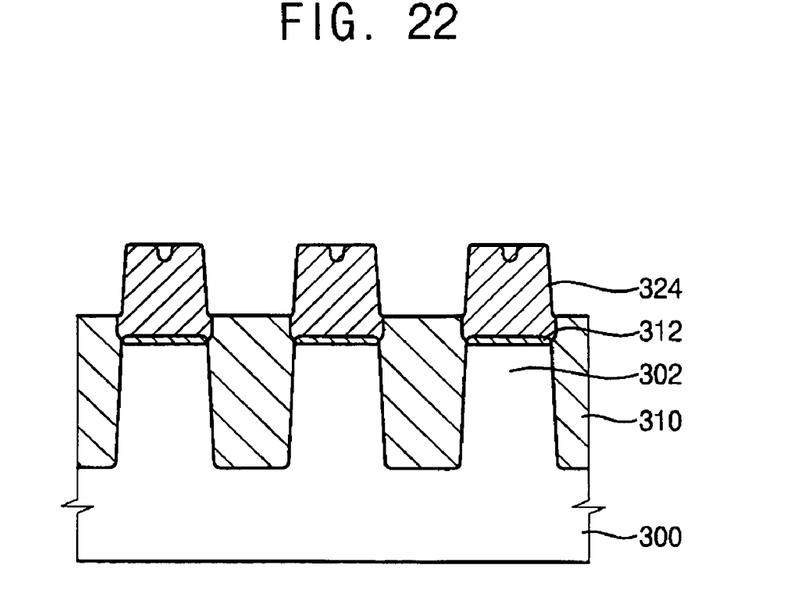

FIGS. 18 and 22 are cross sectional views illustrating a method of manufacturing a semiconductor device in accordance with another exemplary embodiment of the present invention.

Figure 19:
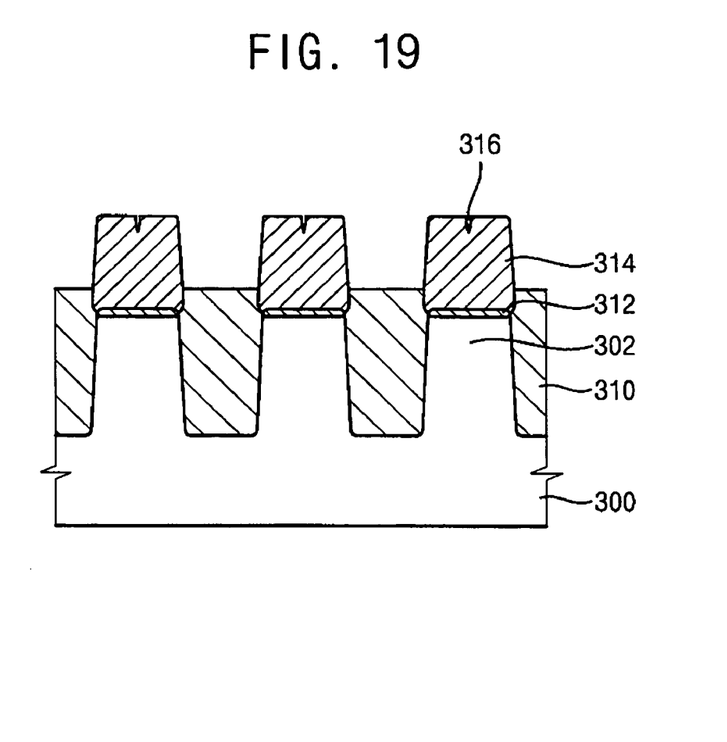

FIGS. 18 and 19 are cross sectional views illustrating a first preliminary polysilicon pattern and a first dielectric layer formed on an active region of a semiconductor substrate.

In this embodiment the same processing steps as described above with respect to FIGS. 1 through 5 may be performed to create a field insulation pattern 310 formed on semiconductor substrate 300. The field insulation pattern 310 may extend in a first direction crossing over the semiconductor substrate 300. A portion of the field insulation pattern 310 may be buried in the semiconductor substrate 300. An active region 302 of the semiconductor substrate 300 may be defined by the field insulation pattern 310.

The first dielectric layer 312 and a first polysilicon layer may be formed over the semiconductor substrate 300 in the same manner as the first dielectric layer 120 and the first polysilicon layer 122 in FIG. 6. A first dielectric layer 312, for example a silicon oxide layer may be formed on the semiconductor substrate 300. A first polysilicon layer (not shown) may be formed on the first dielectric layer 312 and the field insulation pattern 310. The first polysilicon layer may sufficiently fill up a space defined by the field insulation pattern 310 and the first dielectric layer 312.

A chemical mechanical polishing (CMP) process may be performed until an upper face of the field insulation pattern 310 is exposed, thereby forming a first preliminary polysilicon pattern 314 on the first dielectric layer 312. Simultaneously, a void 316 in the first polysilicon layer is exposed by the CMP process.

The process steps for forming the first preliminary polysilicon pattern 314 as illustrated with reference to FIGS. 1 to 7 are omitted herein.

After the CMP process, an upper portion of the field insulation pattern 310 may be partially removed using a diluted hydrofluoric acid solution to partially expose sidewalls of the first preliminary polysilicon pattern 314.

Figure 20:
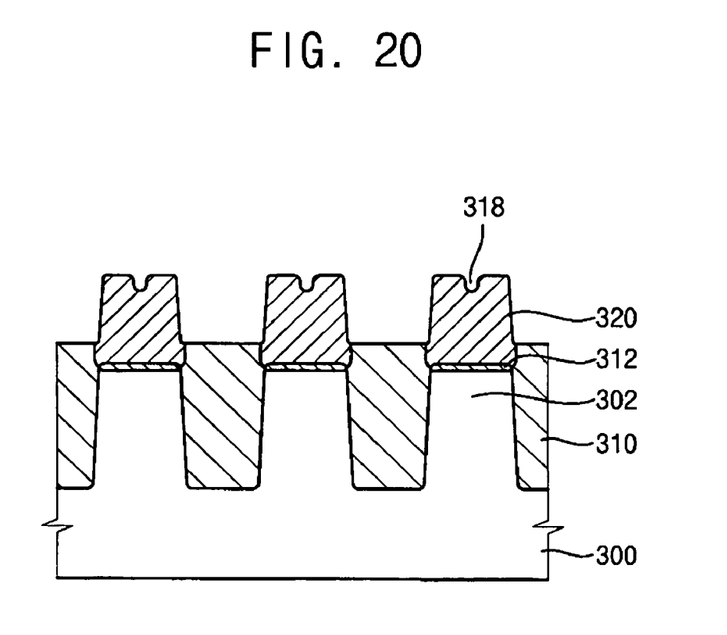

FIG. 20 is a cross sectional view illustrating a second preliminary polysilicon pattern formed on the first dielectric layer in FIG. 18.

Referring to FIG. 20, the exposed void 316 may be expanded with an etchant of SC-1 solution and/or NSC-1 solution to form a second preliminary polysilicon pattern 320 and a recess 318. The recess 318 may have a cross section of an "U" shape and may have an average width of about 100 to about 300 Å.

A byproduct layer such as a silicon oxide layer, which is formed on the second preliminary polysilicon pattern 320 by a reaction between hydrogen peroxide (H2O2) and the first preliminary polysilicon pattern 314 in etching the first preliminary polysilicon pattern 314, may be removed by a wet etching process using diluted hydrofluoric acid solution.

Optionally, when the void is arranged under the upper face of the first preliminary polysilicon pattern 314, the time required for etching using the SC-1 solution and/or the NSC-1 solution may be controlled to expose the void 316 through the upper face of the first preliminary polysilicon pattern 314. The exposed void 316 may be expanded to form the recess 318.

FIG. 21 is a cross sectional view illustrating a second polysilicon layer formed on the second preliminary polysilicon pattern in FIG. 20.

Referring to FIG. 21, the second polysilicon layer 322 may be formed on an upper face and sidewalls of the second preliminary polysilicon pattern 320 and the field insulation pattern 310.

As illustrated in FIG. 21, a second polysilicon layer 322 may be formed on the second preliminary polysilicon pattern 320 to fill the void 316. The second polysilicon layer 322 may have a thickness of no less than about 0.5 times an average width of the recess 318. For example, the second polysilicon layer 322 may have a thickness of about 50 to about 200 Å.

FIG. 22 is a cross sectional view illustrating a polysilicon pattern formed on the second dielectric layer in FIG. 18.

Referring to FIG. 22, a portion of the second polysilicon layer 322 and the second preliminary polysilicon pattern 320 may be partially removed to form a polysilicon pattern 324. An etching process to form the polysilicon pattern 324 may be controlled in accordance with an etching time. In the exemplary embodiment, the desired thickness may be no less than a thickness of the second polysilicon layer 322. Thus, the portion of the second polysilicon layer 322 on the field insulation pattern 310 may be completely removed.

A second dielectric layer (not shown) and a control gate layer (not shown) may be sequentially formed on the polysilicon pattern 324. The control gate layer may be patterned to form a control gate extending in a second direction perpendicular to a first direction. The second dielectric layer, the polysilicon pattern 324 and the first dielectric layer 312 may be successively patterned to expose the active region 302 of the semiconductor substrate 300. A source/drain region (not shown) may be formed on both sides of the exposed active region 302.

As described above, the method of manufacturing the semiconductor device in accordance with example embodiments may be employed in manufacturing a semiconductor device that includes the active region having a width of no more than about 90 nm.

According to the example embodiments of the present invention, a void generated during the manufacture of a semiconductor device having a floating gate may be, for example, removed. Thus, a second dielectric layer on a floating gate may have improved insulation breakdown voltage characteristics and/or leakage current characteristics. Also, a coupling ratio of the capacitor may be improved.

Further, the method of formed the example embodiments of the present invention may be effectively employed in manufacturing a semiconductor device that includes an active region having a width of no more than about 90 nm.

The foregoing is illustrative of the example embodiments of the present invention and is not to be construed as limiting thereof. Although example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed example embodiments, as well as other embodiments, are intended to be included within the scope of the appended claims.

What is claimed is:

1. A method of manufacturing a semiconductor device, comprising:
    forming an insulation pattern over a substrate, the insulation pattern having at least one opening that exposes a surface of the substrate;
    forming a first polysilicon layer over the substrates such that the first polysilicon layer fills the opening, the first polysilicon layer including a void therein;
    removing an upper portion of the first polysilicon layer such that void expands to a recess and the recess is exposed;
    forming a second polysilicon layer over the substrate such that the second polysilicon layer fills the recess; and
    partially removing an upper portion of the second polysilicon layer except for the portion of the second polysilicon layer filling the recess, to form a polysilicon pattern in the opening,
    wherein the removing the upper portion of the first polysilicon layer includes:
        planarizing the first polysilicon layer to expose the void; and
        expanding the void to form the recess.

2. The method of claim 1, wherein the removing step expands a width of the void from a range of about 50 to 100 Angstroms to a range of about 100 to 300 Angstroms in forming the recess.

3. The method of claim 2, wherein the forming a second polysilicon layer forms the second polysilicon layer to a thickness of no less than 0.5 times a width of the recess.

4. The method of claim 1, wherein the removing expands the void to form the recess by wet etching.

5. The method of claim 4, wherein the wet etching process uses a mixture of ammonium hydroxide; hydrogen peroxide, and water.

6. The method of claim 1, wherein the planarizing is performed by chemical mechanical polishing.

7. The method of claim 1, wherein the expanding expands the void to form the recess by wet etching.

8. The method of claim 1, further comprising:
    forming a first dielectric on the exposed portion of the substrate prior to the forming the first polysilicon layer.

9. The method of claim 8, further comprising:
    removing upper portions of the insulation pattern to expose side walls of the first polysilicon layer after the planarizing and prior to the expanding.

10. The method of claim 9, wherein the removing upper portions of the insulation pattern does not reduce a height of the insulation pattern below an upper surface of the substrate.

11. The method of claim 1, wherein the removing the upper portion of the second polysilicon layer etches the second polysilicon layer such that a portion of the second polysilicon layer not in the recess is completely removed.

12. A method of manufacturing a semiconductor device, comprising:
    forming an insulation pattern over a substrate, the insulation pattern having at least one opening that exposes a surface of the substrate;
    forming a first polysilicon layer over the substrates such that the first polysilicon layer fills the opening, the first polysilicon layer including a void therein;
    removing an upper portion of the first polysilicon layer such that void expands to a recess and the recess is exposed;
    forming a second polysilicon layer over the substrate such that the second polysilicon layer fills the recess;
    partially removing an upper portion of the second polysilicon layer except for the portion of the second polysilicon layer filling the recess, to form a polysilicon pattern in the opening; and
    forming a second dielectric layer over the substrate.

13. The method of claim 12, further comprising:
    forming a control gate layer on the second dielectric layer.

14. The method of claim 13, wherein the first polysilicon layer is formed along a first direction and the second dielectric and the control gate layer are formed along a second direction, perpendicular to the first direction.

15. The method of claim 13, wherein the forming the control gate layer forms the control gate layer of first and second conductive layers.

16. The method of claim 12, wherein the removing removes at least part of the upper portion of the first polysilicon layer and expands the void to form the recess by wet etching.

17. The method of claim 16, wherein the wet etching removes at least part of the upper portion of the first polysilicon layer such that the void becomes exposed.

18. The method of claim 16, wherein the removing planarizes the first polysilicon layer prior to wet etching the first polysilicon layer.

19. The method of claim 12, further comprising:
    forming a first dielectric on the exposed portion of the substrate prior to the forming the first polysilicon layer.

20. The method of claim 19, wherein the removing an upper portion of the second polysilicon layer step etches the second polysilicon layer such that a portion of the second polysilicon layer not in the recess is completely removed.

21. The method of claim 19, further comprising:
removing upper portions of the insulation pattern to expose side walls of the first polysilicon layer after the removing the upper portion of the second polysilicon layer.

22. The method of claim 21, wherein the removing upper portions of the insulation pattern does not reduce a height of the insulation pattern below an upper surface of the semiconductor substrate.

* * * * *